(12) United States Patent
Bauer et al.

(10) Patent No.: US 6,864,715 B1
(45) Date of Patent: Mar. 8, 2005

(54) WINDOWING CIRCUIT FOR ALIGNING DATA AND CLOCK SIGNALS

(75) Inventors: Trevor J. Bauer, Boulder, CO (US); Steven P. Young, Boulder, CO (US); Christopher D. Ebeling, San Jose, CA (US); Jason R. Bergendahl, San Mateo, CA (US); Arthur J. Behiel, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/377,461

(22) Filed: Feb. 27, 2003

(51) Int. Cl.[7] .................. G06F 7/38; H03K 19/173; H03D 3/24
(52) U.S. Cl. .................. 326/46; 331/1 A; 375/376
(58) Field of Search .................. 326/46, 16, 38, 326/40; 331/1 A, 17; 375/371, 376, 377; 713/400; 324/76.54; 327/38; 702/177

(56) References Cited

U.S. PATENT DOCUMENTS

| | | | | |
|---|---|---|---|---|
| 3,705,358 A | * | 12/1972 | Bauman et al. | 327/38 |
| 5,579,352 A | * | 11/1996 | Llewellyn | 375/376 |
| 5,636,254 A | * | 6/1997 | Hase et al. | 375/371 |
| 5,724,007 A | * | 3/1998 | Mar | 331/1 A |
| 5,764,714 A | * | 6/1998 | Stansell et al. | 375/377 |
| 5,886,582 A | * | 3/1999 | Stansell | 331/1 A |
| 6,167,526 A | * | 12/2000 | Carlson | 713/400 |
| 6,177,842 B1 | * | 1/2001 | Ahn et al. | 331/1 A |
| 6,239,611 B1 | | 5/2001 | Matera | |
| 6,525,520 B2 | * | 2/2003 | Davidsson et al. | 324/76.54 |
| 6,671,652 B2 | * | 12/2003 | Watson et al. | 702/177 |
| 6,734,703 B1 | * | 5/2004 | Alfke et al. | 326/38 |
| 6,765,444 B2 | * | 7/2004 | Wang et al. | 331/17 |
| 6,798,241 B1 | * | 9/2004 | Bauer et al. | 326/40 |

OTHER PUBLICATIONS

Nick Sawyer, "High Speed Data Serialization and Deserialization (840 Mb/s LVDS)," XAPP265, (1.3), Jun. 19, 2002, available from Xilinx, Inc., 2100 Logic Drive, San Jose, CA., 95124.

Brian Von Herzen, Ph.D. & Jon Brunetti, "Multi–Channel 622 MB/s LVDS Data Transfer for Virtex–E Devices," XAPP233, (v1.2), Jan. 6, 2001, available from Xilinx, Inc., 2100 Logic Drive, San Jose, CA., 95124.

* cited by examiner

*Primary Examiner*—Patrick Wamsley
(74) *Attorney, Agent, or Firm*—Arthur J. Behiel; Edel M. Young; Justin Liu

(57) ABSTRACT

Described are circuits and methods for aligning data and clock signals. Circuits in accordance with some embodiments separate incoming data into three differently timed data signals: an early signal, an intermediate signal, and a late signal. The timing of the three data signals can be collectively moved with respect to the clock signal. In addition, the temporal spacing between the three signals can be adjusted so that the early and late signals define a window encompassing the intermediate signal. The three signals are aligned with respect to the clock edge to center the intermediate data signal on the clock edge. The early and late signals can be monitored to identify changes in the relative timing of the clock and data signals. Some embodiments automatically alter the timing of the data and/or clock signals to keep the intermediate data signal centered on the clock edge.

10 Claims, 10 Drawing Sheets

WINDOWING CIRCUIT FOR ALIGNING DATA AND CLOCK SIGNALS

FIELD OF THE INVENTION

This application relates to integrated circuits, particularly to timing of data transfer between logic elements.

BACKGROUND

"Set-up time" and "hold time" together describe the timing requirements on the data input of a sequential logic element, such as a flip-flop or register, with respect to a clock input. The set-up and hold times define a temporal window during which data must be stable to guarantee predictable performance over a full range of operating conditions and manufacturing tolerances. The set-up time SUT is the length of time that data must be available and stable on the input terminal of a storage element before arrival of a clock edge for the data to be captured by the storage element; the hold time HT is the length of time that the data must remain stable after the arrival of the clock edge.

FIG. 1 (prior art) depicts three clock-to-data timing scenarios that illustrate the relationships between set-up time, hold time, and clock edges for a given flip-flop. The depicted waveforms include sharp signal transitions for ease of illustration; in practice, many variables, including process, temperature, and supply voltage, impact precise edge placement for data and clock signals. The set-up and hold times for a given storage element must meet the requirements for the storage element and account for relative timing variations between the clock and data.

Referring to the first example, a data pulse 100 arrives too late with respect to a clock edge 105 to meet the set-up time requirement, so the flip-flop (not shown) does not capture the data; consequently, the Q output signal is indeterminate.

In the second example, a second data pulse 110 arrives early enough to meet the set-up time requirement, but does not remain high long enough with respect to clock edge 115 to meet the flip-flop's hold time requirement; consequently, the Q output signal is again indeterminate. In the final example, a third data pulse 120 remains stable and valid with respect to a clock edge 125 over a time window that meets both the set-up and hold time requirements. The flip-flop therefore captures the data, causing the output signal Q to transition to a level representative of a logic one.

Set-up and hold-time requirements between flip-flops or registers on the same chip can be met by careful design of the on-chip clock distribution network. It can be difficult, however, to avoid set-up and hold-time problems for sequential storage elements that communicate with data sources external to the chip.

FIG. 2 (prior art) is a simplified diagram of the input portion of a conventional programmable input/output block (IOB) 200 that addresses potential hold-time problems. Input block 200 includes an input buffer 205, programmable delay circuit 210, a sequential storage element 215, and three programmable multiplexers 220, 225, and 230. A programmable multiplexer 240 can be programmed to insert one or both of delay elements 235 into the incoming data path to compensate for clock delays induced by relatively long signal paths in the clock distribution network.

The delays through clock and data paths can vary considerably. The input delay imposed by input block 200 for a given data signal is therefore selected to be relatively large to account for extreme cases. The resulting set-up times work well for relatively low-frequency signals, but unnecessarily limit the maximum operating frequency of IOB 200. This problem is illustrated below in connection with FIGS. 3, 4A, and 4B.

FIG. 3 (prior art) depicts an integrated circuit 300 connected to a simple three-bit bus 303. Three lines D0, D1, and D2 provide parallel data to three respective input blocks 305, 310, and 315 of integrated circuit 300. The data signals D0, D1, and D2 are synchronized to a clock signal CLK on a like-named terminal. (Throughout the present disclosure, signal nodes—e.g., lines, terminals, or pads—and the signals they carry are referred to using like designations; in each case, whether a given reference is to a signal or the corresponding node will be clear from the context.) Input blocks 305, 310, and 315 supply the synchronized data from bus 303 to some core logic 320, which performs some logic operation on the received data.

FIG. 4A is a waveform diagram 400 depicting an example in which the data provided on terminals D0, D1, and D2 to integrated circuit 300 of FIG. 3 are timed slightly differently with respect to clock signal CLK. Despite the timing differences, each data stream satisfies the set-up and hold time requirements for input blocks 305, 310, and 315, and are consequently captured without error.

FIG. 4B is a waveform diagram 450 depicting an example in which timing differences between the data provided on terminals D0, D1, and D2 introduce data errors. The timing differences between the respective data and clock signals are the same as in FIG. 4A, but the shorter period of the clock and resultant reduced data windows cause circuit 300 to latch incorrect data. At time T1, for example, only input block 310 is likely to latch the correct data DT1. As is apparent from this illustration, the effects of timing errors grow more problematic with increased clock frequency. This problem is growing ever more severe as new integrated circuits send and receive data at ever-greater speeds to compete in markets where speed performance is paramount.

To emphasize a problem addressed by the present invention, waveform diagram 450 illustrates an extreme case. Nevertheless, even minor differences in signal-propagation delay between different bits sampled on the same clock edge can introduce undesirable errors. There is therefore a need to more precisely align clocks and data, and in particular a need for improved means for providing per-bit data alignment for high performance integrated circuits.

SUMMARY

The present invention addresses the need for precise, per-bit data alignment for high performance integrated circuits. Circuits and methods in accordance with some embodiments separate incoming data into three differently timed data signals: an early signal, an intermediate signal, and a late signal. The timing of the three data signals can be collectively moved with respect to the clock signal. Moreover, the temporal spacing between the three signals can be adjusted so that the early and late signals define a window centered on the intermediate signal.

In a typical example, the three signals are collectively aligned with the clock. Thus aligned, the three signals are stepwise separated in time until the intermediate data signal is centered on an edge of the clock. The early and late data signals can then be periodically compared with the intermediate data signal. Mismatches between the intermediate data signal and either the early or late data signal indicate that the data has drifted in time relative to the clock. Upon detecting such misalignment, embodiments of the invention automatically adjust the timing of the data signals relative to the clock signal to realign the intermediate data and the clock signal.

Some embodiments of the invention separate incoming data into two differently timed data signals. One such embodiment derives an intermediate signal and a late signal. The timing of the two data signals can be collectively moved with respect to the clock signal, or the two can be separated to center the intermediate data signal on the clock signal. Another such embodiment derives early and intermediate data signals, and can be used with embodiments that derive intermediate and late data signals to produce data windows centered on the intermediate data signals. Yet other embodiments employ two sequential storage elements and some control logic to selectively produce either early and intermediate data signals or intermediate and late data signals. The resulting early and late data signals are then used to synchronize the intermediate data with a clock signal.

In some embodiments, the sequential storage elements used to produce differently timed data are double-data-rate (DDR) flip-flops. One DDR flip-flop in an input block adapted in accordance with the invention includes three sequential storage elements. The first two storage elements capture data on alternate (rising and falling) clock edges; the third storage element enables the DDR flip-flop to produce a pair of DDR output signals both synchronized to the same type of clock edge (e.g., both signals are synchronized to rising clock edges).

This summary does not limit the invention, which is instead defined by the claims.

DETAILED DESCRIPTION

Figure 1:
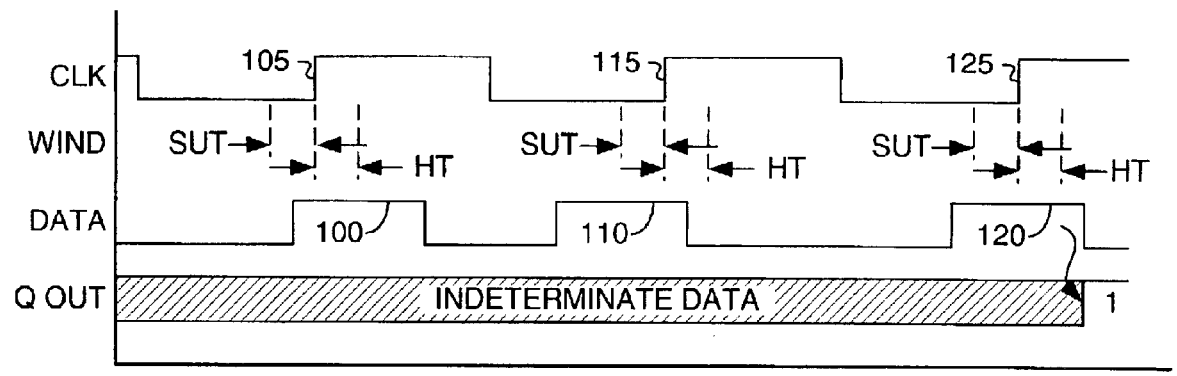
FIG. 1 (prior art) depicts three clock-to-data timing relationships that illustrate the relationships between set-up time, hold time, and clock edges for a given flip-flop.
Figure 2:
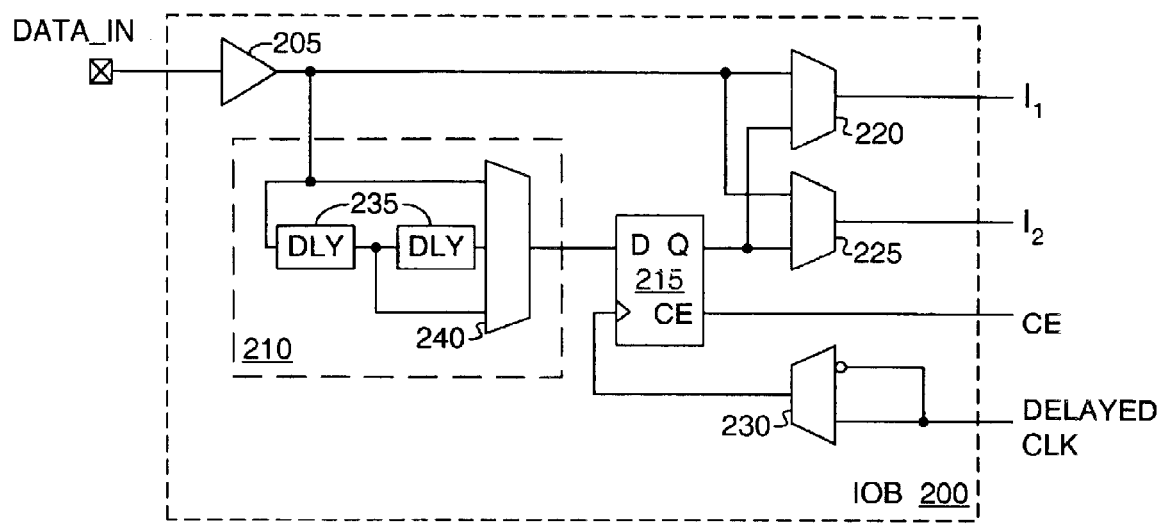
FIG. 2 (prior art) illustrates a conventional programmable input block 200 that addresses potential hold-time problems.
Figure 3:
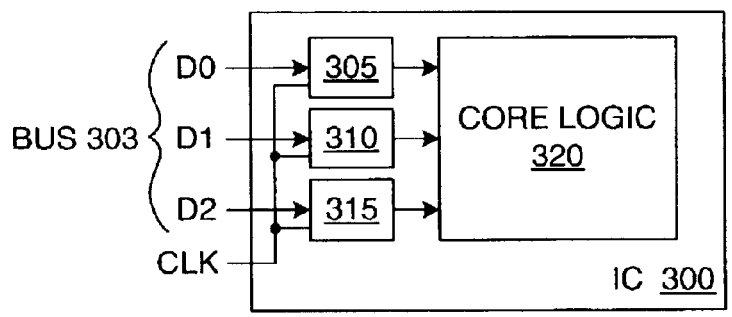
FIG. 3 (prior art) depicts an integrated circuit 300 connected to a simple three-bit bus 303.
Figure 4A:
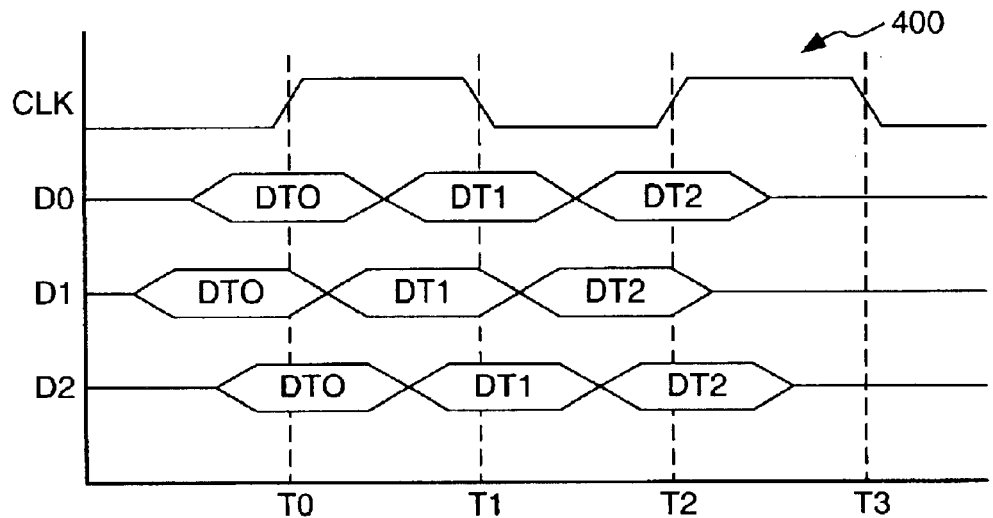
FIGS. 4A and 4B are waveform diagrams 400 and 450, each depicting an example in which the data provided on terminals D0, D1, and D2 to integrated circuit 300 of FIG. 3 are timed slightly differently with respect to a clock signal CLK.
Figure 4B:
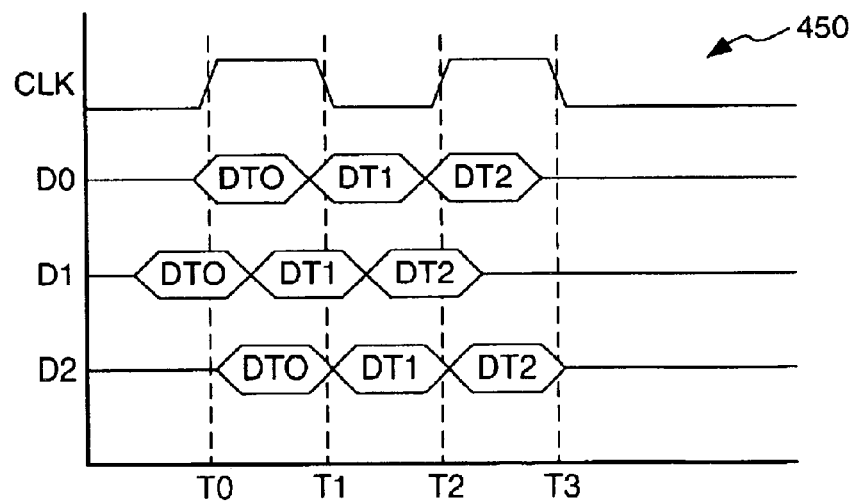
Figure 5:
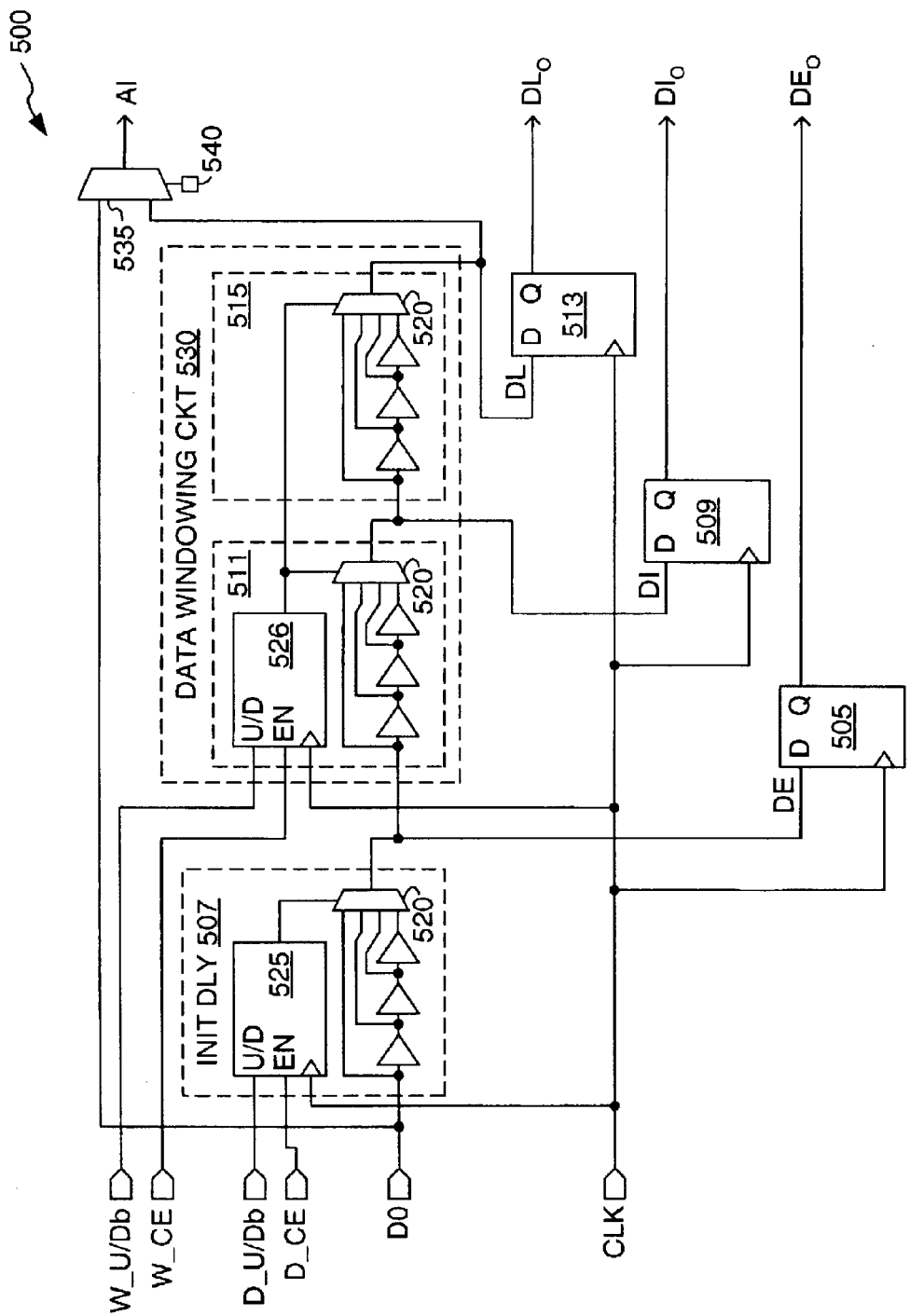
FIG. 5 depicts a data alignment circuit 500 adapted in accordance with one embodiment of the invention to precisely align a data signal on a data input node D0 with a clock signal on a clock input node CLK.

FIG. 5 depicts a data alignment circuit 500 adapted in accordance with one embodiment of the invention to precisely align a data signal on a data input node D0 with a clock signal on a clock input node CLK. In one embodiment, alignment circuit 500 is a portion of an input/output block of a field-programmable gate array (FPGA), or some other type of programmable logic device. Alignment circuit 500 includes three sequential storage elements, each of which includes a data terminal connected to data input node D0. The first sequential storage element 505 connects to data input node D0 via a first direct signal path that includes a first adjustable delay circuit 507; the second sequential storage element 509 includes a second d at a terminal connected to input node D0 via a second direct signal path that includes a second adjustable delay circuit 511 and the first delay circuit 507; and the third sequential storage element 513 connects to data input node D0 via a third direct path that includes a third adjustable delay circuit 515 and the first and second delay circuits 507 and 511.

The signal paths described above a re referred to as "direct" signal paths. For purposes of the present disclosure, a signal between source and destination nodes is a "direct signal path" if the destination node can only receive data streams presented on the source node. Direct signal paths can include intervening elements, such as delay circuits, inverters, or synchronous elements, that preserve a version of the data stream from the source node: direct connections cannot select from among a plurality of unique signal nodes. Direct connections can pass single-ended or differential signals, and can be selective (e.g., established or broken by a programmable connection)

Delay circuits 507, 511, and 515 can be adjusted to vary the instants at which signals on data input node D0 arrive on the respective data input terminals of storage elements 505, 509, and 513. As detailed below, this functionality affords alignment circuit 500 the ability to precisely align data-signal edges (data edges) on input node D0 with clock-signal edges (clock edges) on line CLK.

The initial delay circuit 507 is a conventional delay circuit, and includes a multi-tap delay element with a series of buffers connected to various input terminals of a multiplexer 520. An up/down counter 525 controls the select terminals of multiplexer 520. A pair of control signals D_U/Db and D_CE determines whether counter 525 increments, decrements, or holds the current count in response to rising edges on clock signal CLK. Signal D_CE (for "delay count enable") enables counter 525 to count up when signal D_U/Db is a logic one and down when signal D_U/Db is a logic zero. Though not shown, counter 525 may also include logic (e.g., configuration logic) presetting counter 525 to a predetermined value. Moreover, counter 525 can be implemented as a Gray code counter to avoid discontinuous jumps in tap selection caused by multiple counter outputs changing at slightly different times. A detailed description of Gray-code counters is omitted here, as Gray-code counters are well known to those of skill in the art.

Like delay circuit 507, delay circuits 511 and 515 include multi-tap delay elements coupled to respective multiplexers 520; however, in the depicted embodiment both delay circuits 511 and 515 are controlled by a single up/down counter 526, typically another Gray-code counter. A pair of control signals W_U/Db and W_CE determines whether counter 526 increments, decrements, or holds the current count in response to rising edges on clock signal CLK. Counter 526 may also include logic presetting counter 526 to a predetermined value. Delay circuits 511 and 515 are collectively termed a "data-windowing circuit" 530 for reasons that will become evident in the following discussion. Though not shown, counters 525 and 526 can include overflow terminals that issue overflow signals indicating when their respective counts are at their minimum and maximum values. These may be used, for example, to avoid repeated attempts to increase or reduce the initial delay or window size beyond the available extremes.

Alignment circuit 500 additionally includes an optional bypass 535, in this case a multiplexer controlled by a configurable memory cell 540 to select either the output terminal of delay circuit 515 or data input node D0. The selected node is provided as asynchronous input AI into some core logic (not shown). The three storage elements 505, 509, and 513 receive respective input data signals DE (for "data early"), DI (for "data intermediate"), and DL (for "data late") and store them as respective data output signals $DE_O$, $DI_O$, and $DL_O$. Alignment circuit 500 synchronizes data signal $DI_O$ with a rising edge of clock CLK: the remaining data output signals $DE_O$ and $DL_O$ developed by each input block are used to detect data misalignment in the manner discussed below. In another embodiment, bypass 535 receives the output of delay circuit 511 instead of or in addition to the output of delay circuit 515.

Delay circuits 507, 511, and 515 are simplified for ease of illustration. Actual implementations may vary in the number of delay taps and the delay imposed by each tap. In one embodiment, for example, delay circuit 507 includes 32 taps separated by buffers that impose approximately fifty picoseconds of delay, and each of delay circuits 511 and 515 includes sixteen taps separated by similar fifty-picosecond buffers. The initial delay and the data window in that embodiment can each vary between about zero and 1.5 nanoseconds.

Delay circuits 507, 511, and 515 may be disabled when not in use to save power. Flip-flops 505 and 513 may also be disabled when not in use, such as when an input block is capturing relatively low-speed data that has ample timing margin. The ability to disable unused resources is particularly important when the delay circuits are instantiated as portions of general-purpose input/output blocks, which can be programmed to form myriad functions. (FIG. 12, below, depicts an exemplary circuit for disabling a delay circuit.)

Due to the close proximity of adjacent input blocks, the effects of variables (e.g., temperature and supply voltage) on delay can sometimes be assumed to be similar. A single alignment circuit 500 can therefore be shared among two or more input blocks. In some such embodiments, the other input blocks include a single flip-flop 509 preceded by delay circuits similar to delay circuit 507 and 511 but controlled by the values stored in counters 525 and 526 in the shared alignment circuit.

For simplicity, the clock signal CLK clocking flip-flops 505, 509, and 513 also clocks counters 525 and 526. In other embodiments, counters 525 and 526 are clocked using a separate signal: the signal clocking counters 525 and 526 need not be the same speed as clock signal CLK, and need not be periodic. Counters might also be used that do not require a clock signal at all, or one or both counters can be replaced with some other form of tap-addressing logic.

Figure 6:
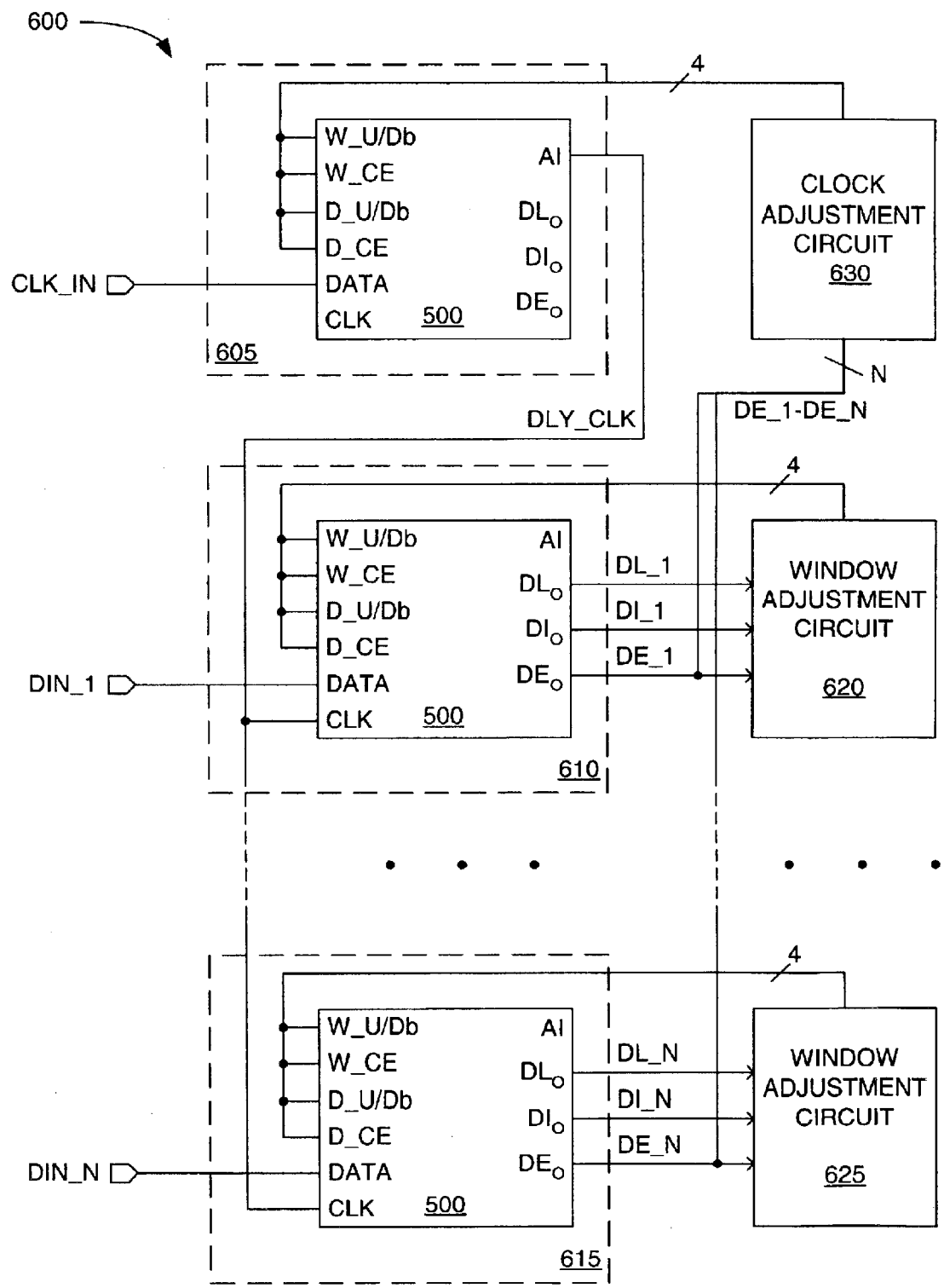
FIG. 6 depicts an illustrative data input module 600 configured to accept N parallel data input signals DIN_1 through DIN_N synchronized to a common input clock CLK_In.

FIG. 6 depicts an illustrative data input module 600 configured to accept N parallel data input signals DIN_1 through DIN_N synchronized to a common input clock CLK_IN. Data input module 600 shows three input blocks 605, 610, and 615, each of which includes an alignment circuit 500 (FIG. 5). Bypass 535 (see FIG. 5) within alignment circuit 500 of input block 605 is configured to present the output of data widowing circuit 530 on asynchronous input terminal AI. Thus configured, input block 605 provides a clock signal DLY_CLK delayed from input clock CLK_IN by the cumulative delays imposed by delay circuits 507, 511, and 515. The delayed clock signal DLY_CLK from input block 605 is fed to the clock terminals of alignment circuits 500 within each of input blocks 610 and 615. The clock signals provided to input blocks 610 and 615 can thus be delayed with respect to input data on terminals DIN_1 through DIN_N by changing the counts within counters 525 and 526 of the alignment circuit 500 within input block 605.

Input blocks 610 and 615 are connected to respective window adjustment circuits 620 and 625 that monitor the early, intermediate, and late data signals ($DE_O$, $DI_O$, and $DL_O$) from each of alignment circuits 500 in input circuits 610 and 615. Window adjustment circuits 620 and 625 connect to window placement control terminals D_U/Db and D_CE and window-size control terminals W_U/Db and W_CE of their respective input blocks to control the placement and width of data windows provided by the associated alignment circuits 500. A clock adjustment circuit 630 connects to window placement control terminals D_U/Db and D_CE and window-size control terminals W_U/Db and W_CE of the input block 605 adapted to receive input clock CLK_IN. Clock-adjustment circuit 630 receives as inputs each early-data signal DE_1 through DE_N from respective input blocks, including input blocks 610 and 615.

Window adjustment circuits 620 and 625 and clock adjustment circuit 630 can be instantiated in logic on the same integrated circuit as input module 600; in other embodiments, window and clock adjustment circuitry is provided externally. In an embodiment in which each input block is an input/output block (IOB) of a Xilinx™ FPGA, for example, the output signals from each input block (e.g., DL_1, DI_1, and DE_1) can each be connected to an IOB pin and still have access to local interconnect.

FIGS. 7A–7E depict waveforms illustrating a process of aligning clock and data signals to input module 600 of FIG. 6. Beginning with FIG. 7A, the delay through input block 605 is preset to the maximum delay (i.e. by maximizing the counts in counters 525 and 526 of alignment circuit 500). In the remaining input blocks (e.g., blocks 610 and 615), the delay through delay circuits 507, 511, and 515 are minimized (e.g., counters 525 and counter 526 are preset to zero). With input module 600 thus configured, a data signal is presented on data input terminal DIN_1. The period of this delay signal is long enough to guarantee a subsequent clock edge arrives before the next data. Because the clock is delayed relative to the input data, the rising edge of a clock pulse 705 of delayed clock DLY_CLK occurs too late to latch the early data DE presented on the data input terminals of respective storage elements 505 in input blocks providing signals DE_1 through DE_N to clock adjustment circuit 630. Clock adjustment circuit 630 thus receives a series of N logic zeros.

Clock adjustment circuit 630 reduces the delay imposed on input clock CLK_IN by decrementing one or both of counters 525 and 526 in the associated data alignment circuit 500 within input block 605. This clock-delay adjustment continues over a number of data samples until one or more of the input blocks receiving data inputs DIN_1 through DIN_N produces a correct early-data sample. The present example assumes that input block 610 first produces a logic one on respective early-data terminal DE 1; however, any of the remaining N−1 input blocks might produce the valid logic-one data as soon or sooner than input block 610. Instead of or in addition to adjusting the delay through input block 605, delay circuit 507 within each input block receiving data can be adjusted to move the data input signals with respect to the delay clock DLY_CLK.

Figure 7A:
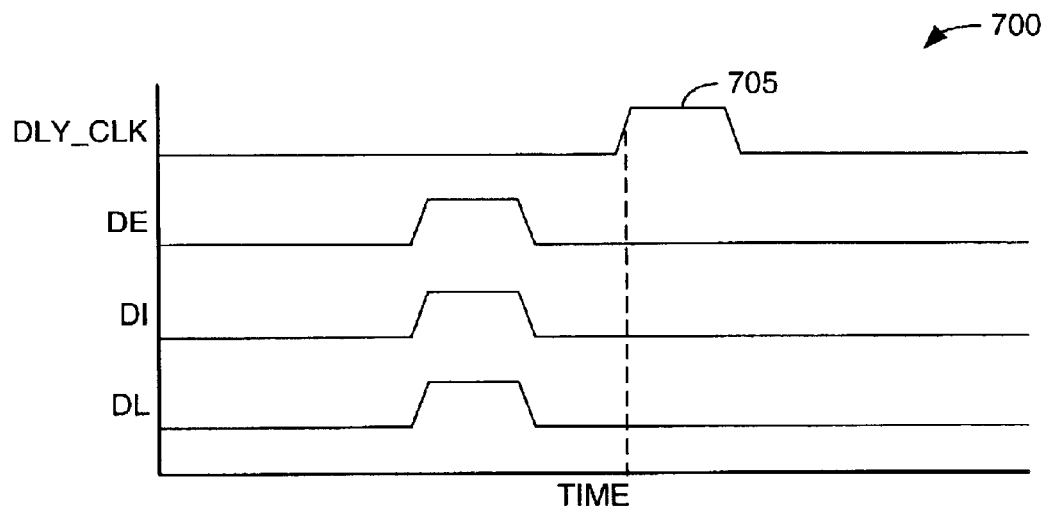
FIGS. 7A–7E depict waveforms illustrating a process of aligning clock and data signals to input module 600 of FIG. 6.
Figure 7B:
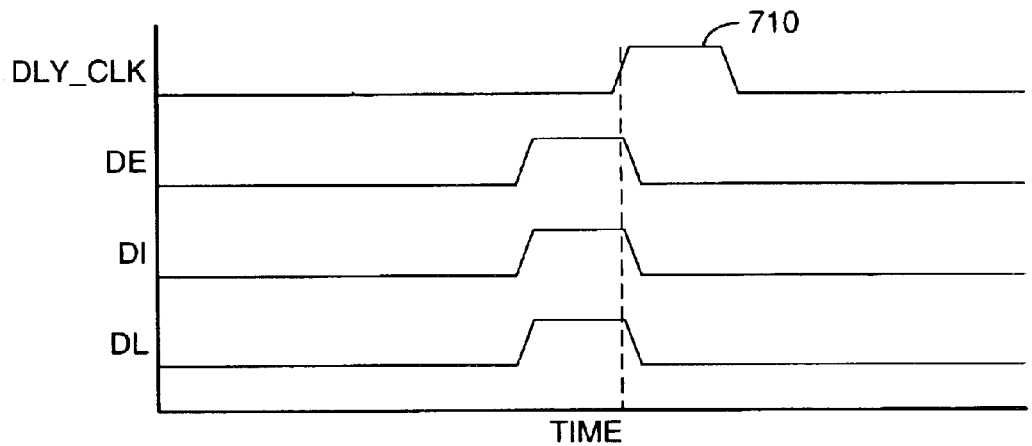

FIG. 7B illustrates the case in which the rising edge of a clock pulse 710 of clock signal DLY_CLK occurs while early data DE expresses a logic one. Because counters 525 and 526 are zeroed at the beginning of the alignment process, the intermediate and late data DI and DE are simultaneous with the early data DE.

Figure 7C:
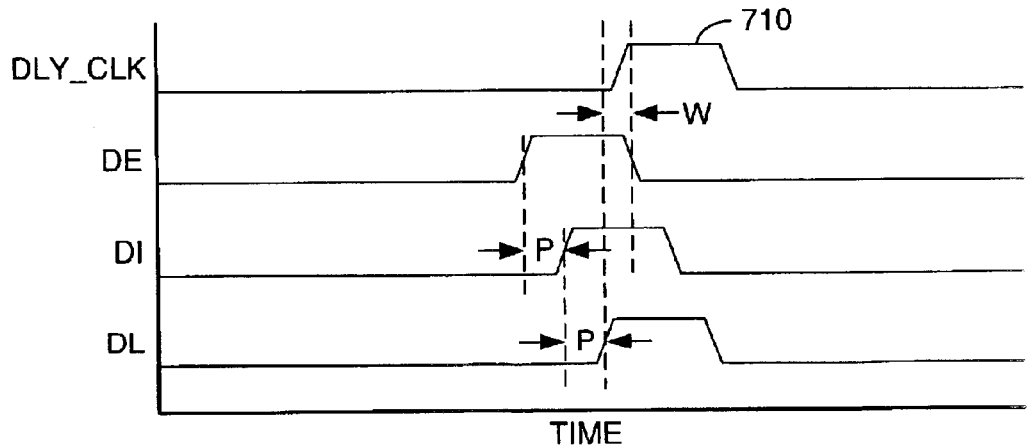

FIG. 7C illustrates how data windowing circuit 530 of input block 610 creates a "window" around data signal DI to storage element 509, thus ensuring the rising edge on delayed clock signal DLY_CLK occurs at or near the center of each data pulse on intermediate data signal DI. Recall that data signal $DI_0$ is the data signal to be conveyed to the core logic or elsewhere for processing, and is consequently the one of data signals $DE_0$, $DI_0$, and $DL_0$ to be synchronized to the clock.

Window adjustment circuit 620 monitors terminals DL_1, DI_1, and DE_1, incrementing counter 526 in input block 610 to increase the delays imposed by adjustable delay circuits 511 and 515 each time input block 610 produces three valid data signals. As a consequence of these adjustments, the intermediate delay signal DI reaches flip-flop 509 a delay period P after early data signal DE reaches flip-flop 505, where P is the delay through delay circuit 511 and is determined by the count in counter 526. The delay through delay circuit 515 is the same delay period P, so late delay signal DL reaches flip-flop 513 a delay period 2P after early delay signal DE reaches flip-flop 505.

Figure 7D:
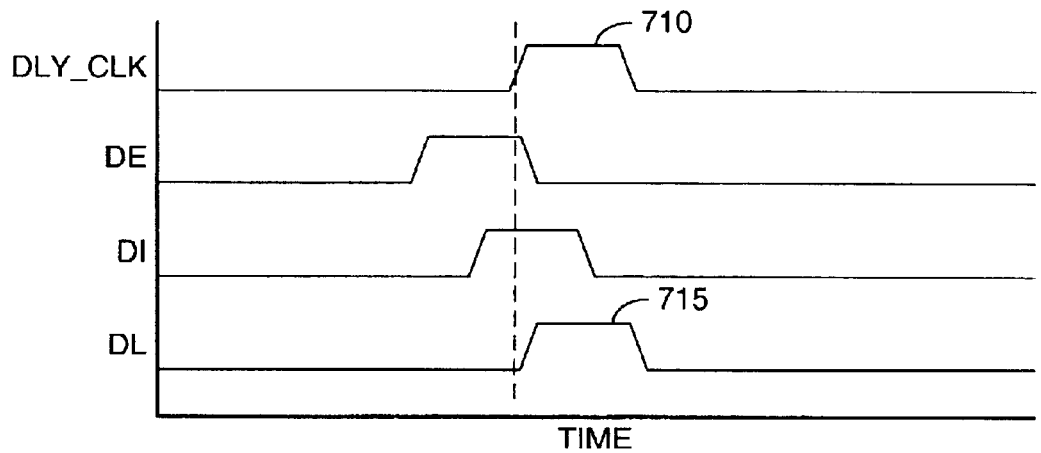

Window adjustment circuit 620 increments counter 526 of input block 610 until the late data pulse 715 is too late for flip-flop 513 to capture, as illustrated in FIG. 7D. Window adjustment circuit 620 then reduces the count in counter 526 of input block 610 to return alignment circuit 500 to a condition, closer to that of FIG. 7C, in which alignment circuit 500 correctly latches each of the early, intermediate, and late data signals. Input block 610 is thus adjusted so that the intermediate data DI is more or less centered on the rising edge of the delayed clock DLY_CLK. The falling edge of the early data DE and the rising edge of the late data DL define a data window W centered on the rising edge of clock pulse 710 (FIG. 7C). In some embodiments, data windowing circuits 530 are preset to provide some minimal level of windowing, which reduces the number of clock cycles required to establish the maximum window width.

The above-described windowing process is repeated for each data input node DIN_2 through DIN_N to individually align the respective received data to the delayed clock DLY_CLK. For these input blocks, however, the delay through block 605 is maintained constant so as not to alter the calibrated clock/data alignment of input block 610. Instead, steps similar to those described in connection with FIGS. 7A and 7B are repeated for each additional input block by incrementing counters 525 within those input blocks to produce relative clock and data timing similar to that depicted in FIG. 7B (recall, from above, that counters 525 were initialized to impose a minimal delay). The intermediate data signal DI is then centered on the rising clock edge using the windowing method described above in connection with FIG. 7C.

Once appropriate counts are established for counters 525 and 526 in each input block, the respective alignment circuits can be permanently or temporarily configured to employ these count values while receiving data. In embodiments in which the input blocks are IOBs on an FPGA, the contents of counters 525 and 526 can be read back as part of the FPGA's state. The resulting delay settings can then be used as default timing parameters, or can be the starting point of a training sequence that establishes appropriate input timing each time IOBs are initialized (a suitable training sequence is described below). Depending upon the desired precision and the deviation between integrated circuits, delay settings identified for a given integrated circuit may be applied to like circuits. For example, larger parts may require longer data input delays than smaller parts, but all parts of the same size might use the same delay settings.

The delays associated with various clock and signal paths can vary over time, as with changes in temperature and voltage. In some embodiments, window adjustment circuit 620 constantly or periodically monitors the outputs of flip-flops 505 and 513 for errors by comparing their contents with that of flip-flop 509. Window adjustment circuit 620 can then adjust the collective delay through delay circuit 507 to re-center incoming data relative to the input clock, adjust the size of the window by altering the contents of counter 526, or adjust the collective delay and the size of the window.

FIG. 7D illustrates a case in which drift, due to temperature or voltage fluctuations for example, has caused the relative timing of the delay clock DLY_CLK to shift earlier in time with respect to the data on lines DE, DI, and DL. In this case, window adjustment circuit 620 receives a pair of logic-one voltage levels on lines DE_1 and DI_1, but receives an un-matching logic zero level on terminal DL_1. Window adjustment circuit 620 therefore decrements counter 525 of input block 610 until data signals DE_1, DI_1, and DL_1 once again match. Where alignment circuit 500 of input block 610 is responsible for aligning more than one input data signal with respect to delayed clock DLY_CLK, window adjustment circuit 620 can, instead of decrementing counter 526 of input block 610, increment counter 525 or 526 in input block 605 to produce the desired alignment.

Figure 7E:
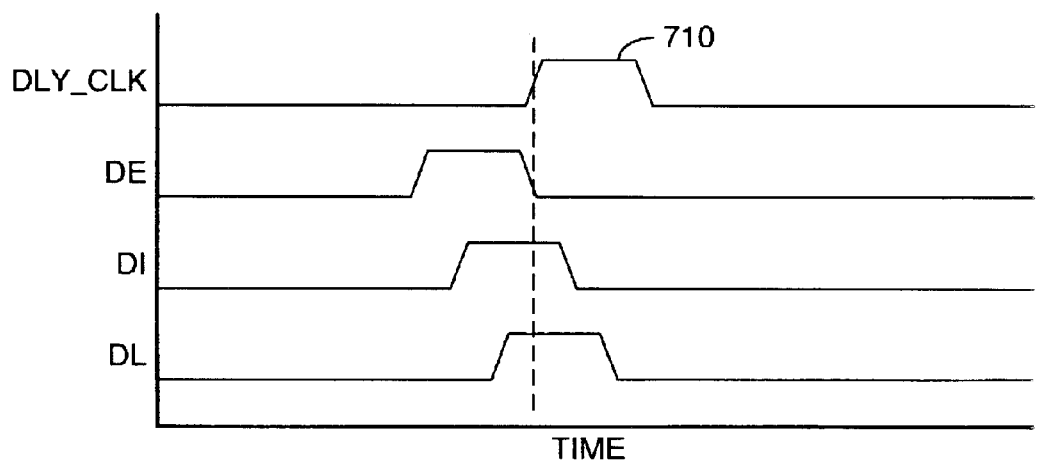

FIG. 7E illustrates the case in which the clock signal on delay clock DLY_CLK has shifted to a later time with respect to the data, so that the early data DE fails to latch into flip-flop 505. In this case, window adjustment circuit 620 increments counter 525 in input block 610 (or decrements counter 525 or 526 in input block 605) until the three output data signals once again match.

In each of the examples of FIGS. 7D and 7E, signal drift caused one of the early or late data to indicate an error before the drift introduced an error on line DI_1: the data signal DI_1, which is used to convey the incoming data to the core logic, remains error free. Alignment circuit 500 can thus be used to compensate for variation and drift that may result from process, temperature, or voltage fluctuations.

Figure 8:
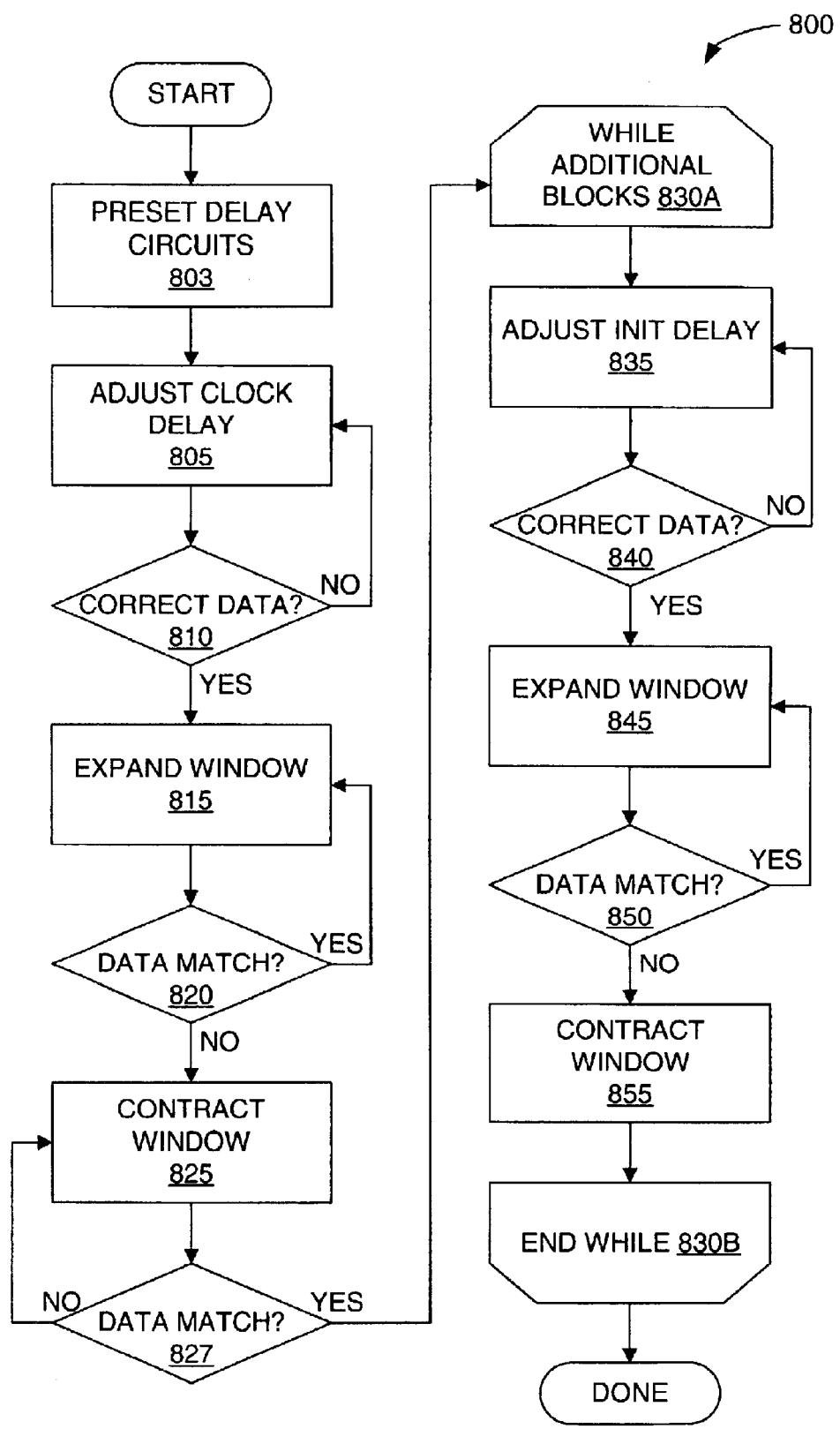
FIG. 8 is a flow chart 800 depicting the process of aligning data and clock signals for configuration 600 of FIG. 6.

FIG. 8 is a flow chart 800 depicting an exemplary training sequence for aligning data and clock signals using configuration 600 of FIG. 6. First, the delay circuits within each input block of interest are preset in the manner described above in connection with FIG. 7A (step 803). The relative timing between the input clock signal and the input data signal is then adjusted step-by-step until at least one of the three versions of the data input signal (e.g., DE, DI, and DL) is captured by the input clock (steps 805 and 810). FIG. 7B illustrates an exemplary result of steps 805 and 810.

Next, the process moves to step 815 in which the data window provided by windowing circuit 530 is expanded by incrementing the counter 526 in the input block of interest. Per decision 820, this expansion is repeated for as long as the early, intermediate, and late data match. Upon the first data mismatch, the delay through windowing circuit 530 is contracted (step 825). The reduction continues, per decision 827, until the data match once again. In some embodiments, the window is contracted more than what is required for a match, thus providing a guard band to account for some measure of jitter on the data and clock lines. In other embodiments, the window is contracted one delay increment by decrementing counter 526 and decision 827 is skipped.

Once the initial delay and window size are established for the first data input block, the alignment process continues for each additional input block to be synchronized with the input clock. A while-loop bounded by steps 830A and 830B repeats for each additional data input block.

At step 835, the initial delay of the selected input block is increased by incrementing counter 525. In accordance with decision 840, the initial delays is increased, step-by-step, until the three data inputs latch correctly into the input block under test. (This condition is illustrated in FIG. 7B.) Next, the data window is expanded (step 845) until decision 850 detects an error, and is then contracted to re-establish an error-free setting (step 855). Steps 845 through 855 are identical to steps 815 through 825. The while-loop is repeated for each remaining input block until all related input blocks are calibrated.

Flowchart 800 is intended to convey a conceptual understanding of a training sequence suitable for use in accordance with some embodiments of the invention. In practice, training one or more alignment circuits may be more of an iterative process in which clock delays, initial data delays, and windowing are tweaked to obtain optimum delay parameters. Once known for a given input configuration, the delay parameters can be noted for later use in the same or similar devices, can be fixed by holding the counts within counters 525 and 526, or the delay parameters can be used as starting points for some form of active or periodically active window adjustment circuit that dynamically adjusts widow delay and width as needed.

Figure 9:
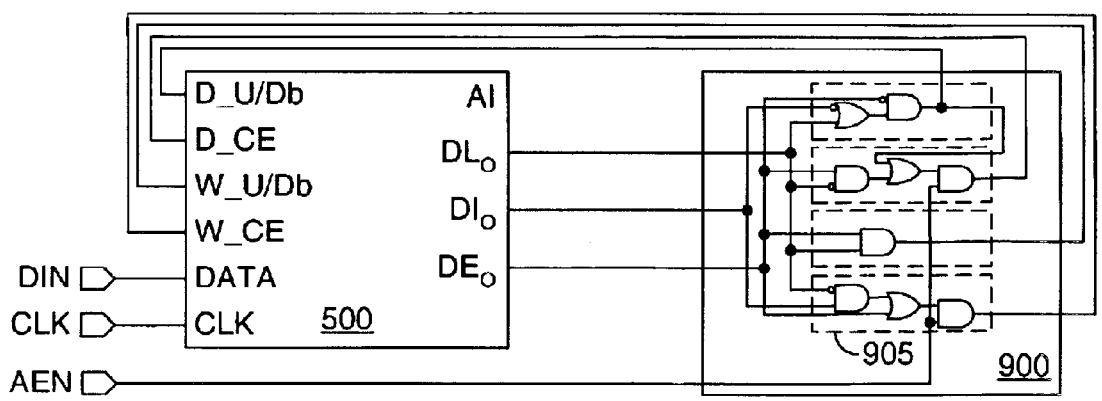
FIG. 9 depicts an alignment and window adjustment circuit 900 for use in one embodiment of the invention.

FIG. 9 depicts a window adjustment circuit 900 adapted in accordance with an embodiment of the invention to "train" alignment circuit 500 of FIG. 5 in the manner discussed above in connection with FIGS. 7A–7E. Window adjustment circuit 900 includes a collection of combinatorial logic arranged in four groups 905 demarcated using broken boundaries. Each group 905 can be instantiated in a single four-input look-up table (LUT) of the typed found in Xilinx™FPGAs. These four groups, in response to logic-one test data, provide delay and window-adjustment signals as necessary to define a data window centered on a clock edge.

Before commencing the alignment process, the initial delay and window settings are minimized to create a condition similar to that depicted in FIG. 7A. Asserting an alignment-enable signal AEN then allows circuit 900 to logically combine the data provided by data alignment circuit 500 in response to logic-one test data.

The following Table 1 depicts the logic performed by the four groups 905 and summarizes the action taken in response to the signals provided by window adjustment circuit 900. In the first row of Table 1, for example, the early, late, and intermediate data all erroneously capture logic zeroes, indicating the condition depicted in FIG. 7A. Circuit 900 responds by incrementing counter 525 (FIG. 5) within data alignment circuit 500 to increase the collective delay imposed on the late, intermediate, and early data. This step will repeat for each new clock/data test combination until one or more storage elements within data alignment circuit 500 captures a logic one. In the example of FIG. 7B, all three storage elements eventually capture the correct logic-one data, the condition indicated in the last row of Table 1. Circuit 900 responds by incrementing counter 526 (FIG. 5) within data alignment circuit 500 to increase the size of the data window. Adjustment circuit 900 will continue to sample data and, based on the results, adjust the initial delay and window delays within circuit 500 for as long as the enable signal AEN is asserted.

Eventually, adjustment circuit 900 and data alignment circuit 500 will more or less center the intermediate data signal DI on the corresponding clock edge. Enable signal AEN can then be de-asserted and the delay settings captured for future use.

TABLE 1

| DE | DI | DL | D_U/Db | D_CE | W_U/Db | W_CE | ACTION |
|---|---|---|---|---|---|---|---|
| 0 | 0 | 0 | 1 | 1 | 0 | 0 | ↑ Delay |
| 1 | 0 | 0 | 0 | 1 | 0 | 1 | ↓ Delay, ↓ Window |
| 0 | 1 | 0 | 0 | 0 | 0 | 1 | ↓ Window |
| 1 | 1 | 0 | 0 | 1 | 0 | 1 | ↓ Delay, ↓ Window |
| 0 | 0 | 1 | 1 | 1 | 0 | 0 | ↑ Delay |
| 1 | 0 | 1 | 0 | 0 | 1 | 1 | ↑ Window (Error) |
| 0 | 1 | 1 | 1 | 1 | 0 | 0 | ↑ Delay |
| 1 | 1 | 1 | 0 | 0 | 1 | 1 | ↑ Window |

Instantiating window adjustment circuit 900 in configurable logic affords the ability to personalize the alignment circuit for a desired result. For example, the above-described training sequences assume logic-one valid data to be captured on the rising edge of a clock signal: circuit 900 can be modified for use with valid data expressed as logic-zeroes or combinations of ones and zeroes, data captured on the falling edge of a clock signal, or data captured on both rising and falling edges of clock signals.

Figure 10:
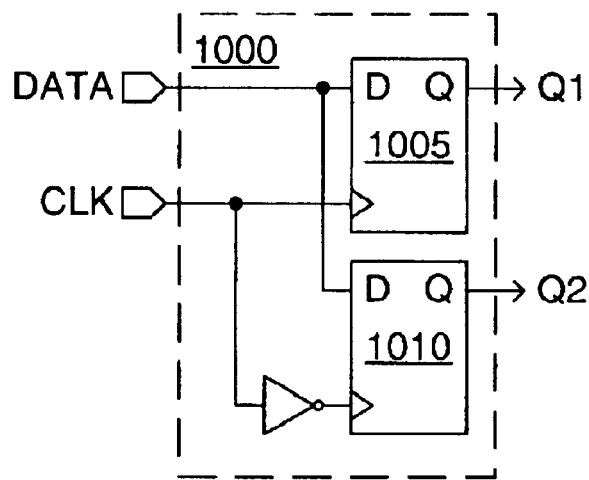
FIG. 10 (prior art) depicts a conventional double-data-rate input flip-flop 1000.

Alignment circuit 500 is especially useful for data with relatively small valid-data windows. Many such circuits employ double data rate (DDR) input and output circuitry to facilitate high-speed communication. In one embodiment of the invention, each of flip-flops 505, 509, and 513 within an input/output block of an FPGA is replaced with a DDR input flip-flop of the type depicted in FIG. 10. The operation of the resulting alignment circuit is identical to that of FIG. 5, except the pair of storage elements 1005 and 1010 within DDR input flip-flop 1000 provides alternating data signals on output terminals Q1 and Q2.

Figure 11:
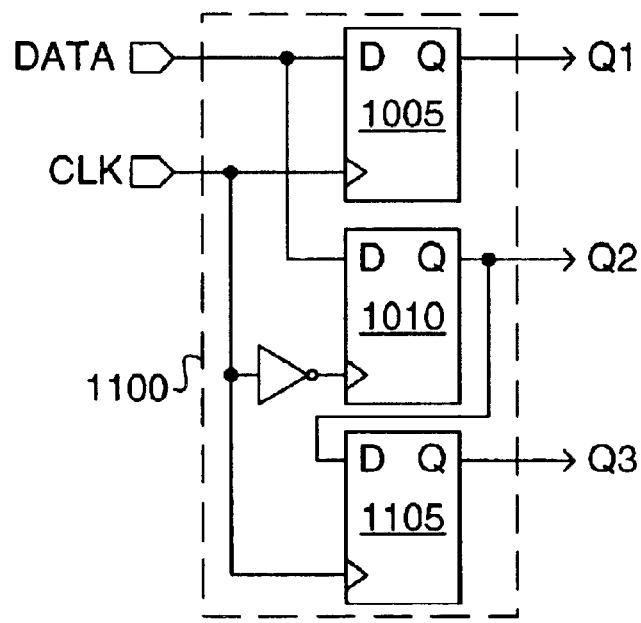
FIG. 11 depicts a double-data-rate input flip-flop 1015 confined within an input/output block of an FPGA adapted in accordance with an embodiment of the invention.

FIG. 11 depicts a DDR input flip-flop 1100 confined within an input/output block of an FPGA adapted in accordance with an embodiment of the invention. Input flip-flop 1100 is identical to input flip-flop 1000 of FIG. 10, except that input flip-flop 1100 includes a third storage element 1105 having a data terminal directly connected to the Q output of storage element 1010. This third storage element 1105 is included so that the DDR outputs on terminals Q1 and Q2 are both synchronized to the rising edge of the clock signal on line CLK. Similar circuits have been employed in programmable logic. See, for example, FIG. 8 of the Xilinx™ application note by Nick Sawyer entitled "High-Speed Data Serialization and Deserialization (840 Mb/s LVDS)," XAPP265 (1.3), published Jun. 19, 2002 by Xilinx, Inc., which is incorporated herein by reference. Such examples differ from DDR input flip-flop 1100, however, in that storage element 1105 of flip-flop 1100 is part of the same input/output block as storage elements 1005 and 1010 and includes a data terminal directly connected to the output of storage element 1010. The proximity and direct connection provide performance advantages in input circuits that employ DDR flip-flop 1100.

Figure 12:
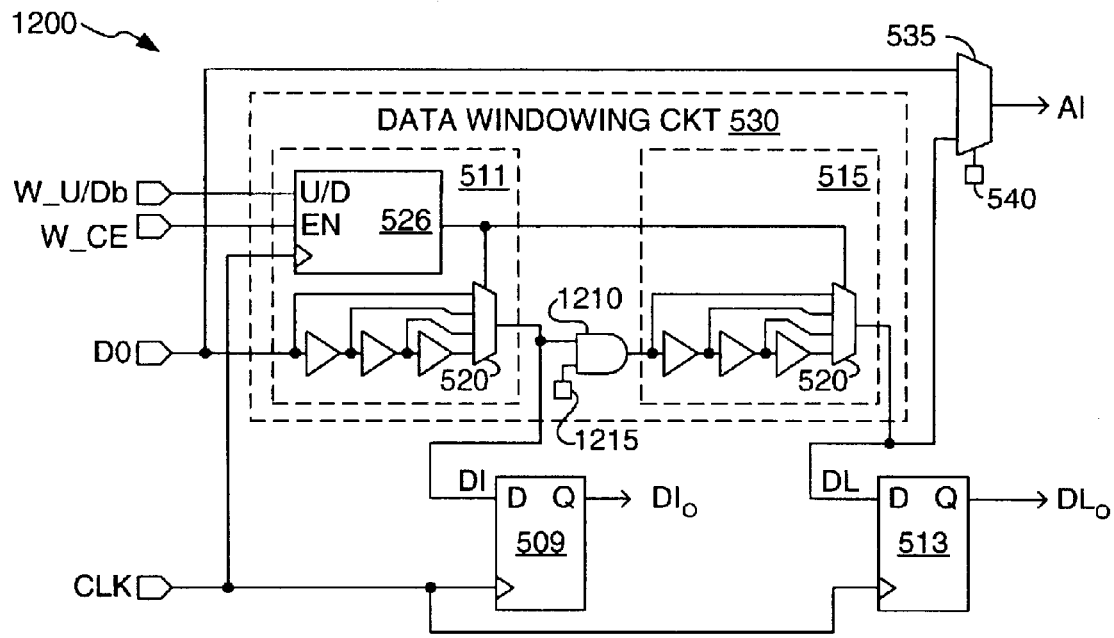
FIG. 12 depicts a data alignment circuit 1200 in accordance with another embodiment of the invention.

FIG. 12 depicts a data alignment circuit 1200 in accordance with another embodiment of the invention. Alignment circuit 1200 is similar to alignment circuit 500 of FIG. 5, like-identified elements being the same or similar, and is similarly adapted to align a data signal on a data input node D0 with a clock signal on a clock input node CLK. Alignment circuit 1200 omits the components of circuit 500 associated with early data signal DE, and consequently includes only two sequential storage elements. Alignment circuit 1200 also omits initial delay circuit 507, but this can be included if desired.

Figure 13A:
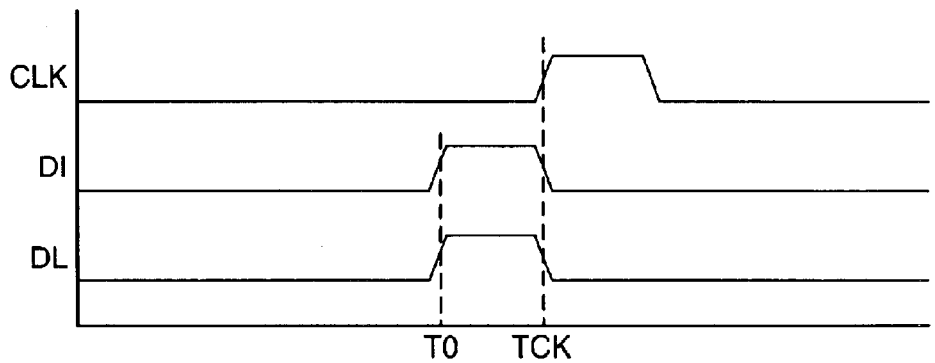
FIGS. 13A and 13B depict waveforms illustrating a process of aligning clock a nd data signals using data alignment circuit 1200 of FIG. 12.
Figure 13B:
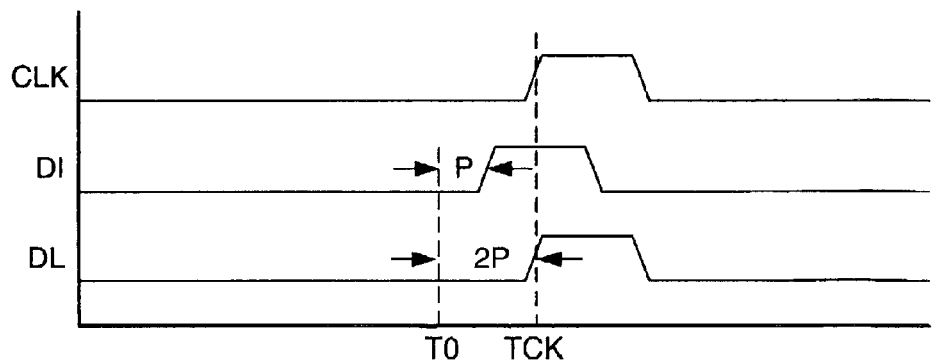

Alignment circuit 1200 aligns data signal DI in a manner similar to alignment circuit 500. Referring to FIG. 13A, the timing of the two data signals DI and DL are first adjusted with respect to clock signal CLK until one or both of the data signals just latch into respective storage elements 509 and 513. The data and clock signals may be brought together by delaying the input data, clock, or both. In a typical example, an on-chip clock management circuit might be used to adjust the clock timing. Counter 526 can then be incremented while comparing the contents of storage elements 509 and 513. Delay signal DI is assumed to be approximately centered on the rising edge of the clock signal when storage element 513 first fails to latch the correct input data (FIG. 13B).

Alignment circuit 1200 includes an AND gate 1210 connected between delay circuits 511 and 515, one input terminal of which connects to a memory cell 1215. Programming memory cell 1215 to a logic zero disables delay circuit 515 when windowing is not used or when the desired count is known. Disabling delay circuit 515 when not in use saves power.

As with alignment circuit 500 above, alignment circuit 1200 can be simplified by employing a one-directional counter in place of counter 526 (e.g., an up counter). In other embodiments, some input blocks produce early and intermediate data DE and DI, instead of intermediate and late data DI and DL as does alignment circuit 1200. Due to the close proximity of adjacent input blocks, the effects of variables (e.g., temperature and supply voltage) on delay can sometimes be assumed to be similar. Two or more input circuits can therefore share resources to identify errors associated with early and late data. For example, alignment circuit 1200 could alter the clock delay or input delays for a series of input blocks in response to a failure to capture late data, and a second input block having an early data register can similarly control the series of input blocks in response to a failure to capture early data.

Figure 14:
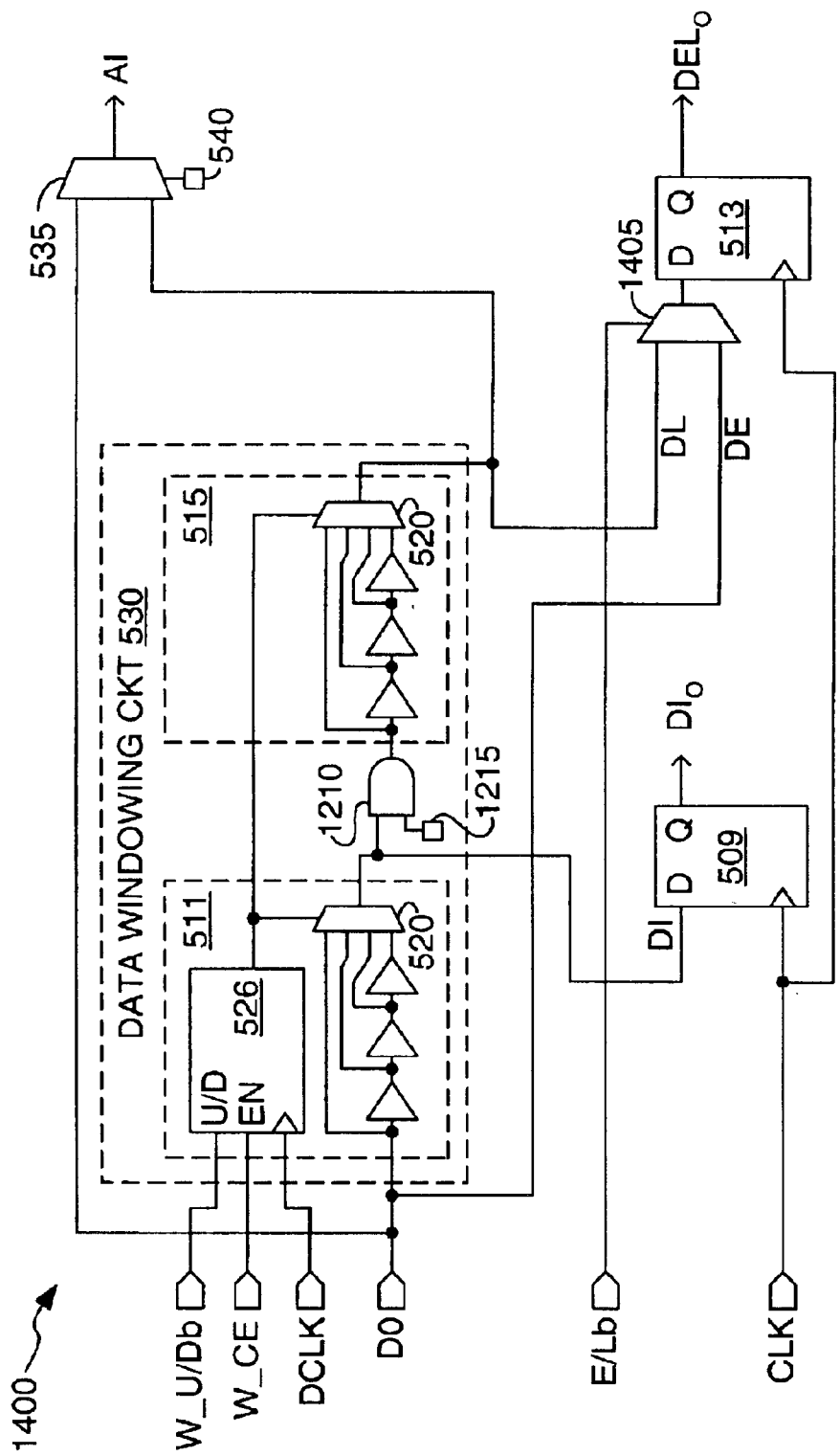
FIG. 14 depicts a data alignment circuit 1400 in accordance with another embodiment of the invention.

FIG. 14 depicts a data alignment circuit 1400 in accordance with another embodiment of the invention. Alignment circuit 1400 is similar to alignment circuit 1200 of FIG. 12, like-identified elements being the same or similar. Counter 526 receives a separate clock signal DCLK, typically slower than input clock CLK. Alignment circuit 1400 additionally includes multiplexer 1405 that selectively provides either the input of delay circuit 511 or the output of delay circuit 515 on the data input terminal of flip-flop 513, depending upon the logic level provided on a early/late control terminal E/Lb. A logic one on terminal E/Lb sends the input of delay circuit 511 to flip-flop 513, so flip-flop 513 captures "early data"; a logic zero on terminal E/Lb sends the output of delay circuit 515 to flip-flop 513, so flip-flop 513 captures "late data." Alignment circuit 1400 can therefore be used to define data windows in the manner described above in connection with FIGS. 5–8, except the early and late data are monitored at different times.

While the present invention has been described in connection with specific embodiments, variations of these embodiments will be obvious to those of ordinary skill in the art. For example:

1. The ratio of the delays imposed on the late and intermediate data is two-to-one in the foregoing examples, but this need not be the case. Other ratios might be preferred, e.g. to place the clock edge at a different spot with respect to the intermediate data. This might be desirable if, for example, differently sized guard bands are desired on either side of a clock edge. Different delay ratios can be accomplished, for example, by providing separate delay mechanisms to separate the intermediate data from the early and late data (e.g., by controlling delay circuit 515 of FIG. 5 with a dedicated counter similar to counter 526).
2. While each of the foregoing training sequences begin with the clock signal delayed with respect to the data signal, training sequences can just as easily begin with the data signals delayed with respect to the clock.
3. Individual data bits can be aligned using a windowing scheme in which the data arrive simultaneously to a plurality of sequential storage elements clocked by differently timed versions of the same clock (initial and windowing delays are imposed on the clock signal instead of the data signal).
4. Many of the foregoing circuits are termed "input" or "output" circuits for convenience, but this terminology is not intended to limit their use with circuits adapted to communicate with external components.
5. The variable delay circuits used for windowing (e.g., delay circuit 511 and 515 of data windowing circuit 530) can be substituted with fixed or programmable delay circuits.

Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. An alignment circuit for aligning a data signal with a clock signal, the alignment circuit comprising:
   a. a clock input node receiving the clock signal;
   b. a data input node receiving the data signal;
   c. data-windowing circuit comprising:
      an adjustable first delay circuit having a first delay-circuit input terminal connected to the data input node and a first delay-circuit output terminal; and
      ii. an adjustable second delay circuit having a second delay-circuit input terminal connected to the first delay-circuit output terminal and a second delay-circuit output terminal;

d. a first sequential storage element having a first storage-element input terminal connected to the first delay-circuit output terminal, a first clock terminal connected to the clock input node, and a first synchronous output terminal; and e. a second sequential storage element having a second storage-element input terminal connected to the second delay-circuit output terminal, a second clock terminal connected to the clock input terminal; and a second synchronous output terminal.

2. The alignment circuit of claim 1, further comprising a window-adjustment circuit having a first window-adjustment input terminal connected to the first synchronous output terminal, a second window-adjustment input terminal connected to the third second synchronous output terminal, and a window-adjustment output port.

3. The alignment circuit of claim 2, the data-windowing circuit further comprising a window-size control terminal connected to the window-adjustment output terminal port.

4. The alignment circuit of claim 1, further comprising control logic having a control terminal, a first control-logic input terminal connected to the first delay-circuit input terminal, a second control-logic input terminal connected to the second delay-circuit output node, and a control-logic output terminal connected to the second storage element input terminal.

5. The alignment circuit of claim 4, wherein the control logic selectively connects the second storage element input terminal to the first delay-circuit input terminal or the second delay-circuit output node.

6. The alignment circuit of claim 1, further comprising a third sequential storage element having a third storage-element input terminal connected to the first delay-circuit input terminal, a third clock terminal connected to the clock input terminal, and a third synchronous output terminal.

7. The alignment circuit of claim 1, further comprising an adjustable third delay circuit having a third delay-circuit input node connected to the data input node and a third delay-circuit output node connected to the first delay-circuit input node.

8. The alignment circuit of claim 7, the third delay circuit including a window-placement control terminal.

9. The alignment circuit of claim 1, further comprising a bypass having a first bypass input terminal connected to the data input node, a second bypass input terminal connected to the second storage-element input terminal, and a bypass output terminal, the bypass selectively connecting one of the first and second bypass input terminals to the bypass output terminal.

10. An alignment circuit for aligning a clock edge with a data edge comprising:

a plurality of circuits for generating adjustable delay including:
a first circuit for generating adjustable delay, and
a second circuit for generating adjustable delay;

a clock signal applied to the first circuit for generating adjustable delay, the first circuit providing a delayed clock signal;

a data signal applied to the second circuit for generating adjustable delay, the delayed clock signal also being applied to the second (circuit for generating adjustable delay, the second circuit providing a delayed data output signal; and a clock adjustment circuit connected to receive the delayed data output signal and provide a control signal to the first circuit for generating adjustable delay to control delay of the first circuit for generating adjustable delay.

* * * * *